(12) United States Patent
Rofougaran et al.

(10) Patent No.: US 7,885,683 B2
(45) Date of Patent: *Feb. 8, 2011

(54) METHOD AND SYSTEM FOR SIMULTANEOUS FM TRANSMIT AND FM RECEIVE FUNCTIONS USING AN INTEGRATED BLUETOOTH LOCAL OSCILLATOR GENERATOR (LOGEN)

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 851 days.

This patent is subject to a terminal disclaimer.

(21) Appl. No.: 11/754,708

(22) Filed: May 29, 2007

(65) Prior Publication Data

US 2008/0233873 A1    Sep. 25, 2008

Related U.S. Application Data

(60) Provisional application No. 60/895,698, filed on Mar. 19, 2007.

(51) Int. Cl.
  *H04B 7/00* (2006.01)
  *H04B 7/12* (2006.01)
  *H04B 1/06* (2006.01)
  *H04B 1/26* (2006.01)
  *H04M 1/00* (2006.01)

(52) U.S. Cl. .................. 455/552.1; 455/41.2; 455/141; 455/255; 455/318; 455/553.1

(58) Field of Classification Search ....... 455/41.2–41.3, 455/255–265, 132–141, 313–326, 333, 552.1–553.1
See application file for complete search history.

(56) References Cited

U.S. PATENT DOCUMENTS

| | | | | |
|---|---|---|---|---|
| 6,960,962 B2 * | 11/2005 | Peterzell et al. | ............... | 331/40 |
| 2002/0150147 A1 * | 10/2002 | Liang | .......................... | 375/133 |
| 2005/0090208 A1 * | 4/2005 | Liao | ........................... | 455/112 |
| 2005/0117071 A1 * | 6/2005 | Johnson | ...................... | 348/729 |
| 2005/0239499 A1 * | 10/2005 | Oosawa et al. | ........... | 455/552.1 |

* cited by examiner

*Primary Examiner*—Simon D Nguyen
(74) *Attorney, Agent, or Firm*—McAndrews, Held & Malloy, Ltd.

(57) ABSTRACT

Aspects of a method and system for enabling simultaneous FM transmitter and FM receiver functions using an integrated Bluetooth Local Oscillator Generator (LOGEN). A Bluetooth® LOGEN may be utilized to generate Bluetooth® signal that comprise (I) and (Q) components for use in Bluetooth® communication. The Bluetooth® LOGEN may then be utilized by a DDFS to generate FM radio (I) and (Q) signals for FM radio reception. The Bluetooth® LOGEN may also be utilized by a second DDFS to generate FM radio (I) and (Q) signals for FM radio reception. The Bluetooth® signals may be kept at the same frequency, or reduced in frequency, for use in clocking the DDFS. A frequency word may also be utilized to clock the two DDFS. The outputs of each DDFS may be a constant frequency while the inputs to each DDFS may vary in frequency.

36 Claims, 7 Drawing Sheets

METHOD AND SYSTEM FOR SIMULTANEOUS FM TRANSMIT AND FM RECEIVE FUNCTIONS USING AN INTEGRATED BLUETOOTH LOCAL OSCILLATOR GENERATOR (LOGEN)

CROSS-REFERENCE TO RELATED APPLICATIONS/INCORPORATION BY REFERENCE

This application makes reference to, claims priority to, and claims benefit of U.S. Provisional Application Ser. No. 60/895,698 filed Mar. 19, 2007.

This application also makes reference to:

U.S. patent application Ser. No. 11/754,481, filed May 29, 2007;

U.S. patent application Ser. No. 11/754,460, filed May 29, 2007;

U.S. patent application Ser. No. 11/754,581, filed May 29, 2007;

U.S. patent application Ser. No. 11/754,621, filed May 29, 2007;

U.S. patent application Ser. No. 11/754,490, filed May 29, 2007;

U.S. patent application Ser. No. 11/754,768, filed May 29, 2007;

U.S. patent application Ser. No. 11/754,705, filed May 29, 2007;

U.S. patent application Ser. No. 11/754,600, filed May 29, 2007;

U.S. patent application Ser. No. 11/754,407, filed May 29, 2007; and

U.S. patent application Ser. No. 11/754,438, filed May 29, 2007.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable].

FIELD OF THE INVENTION

Certain embodiments of the invention relate to wireless communication. More specifically, certain embodiments of the invention relate to a method and system for enabling simultaneous FM transmitter and FM receiver functions using an integrated Bluetooth Local Oscillator Generator (LOGEN).

BACKGROUND OF THE INVENTION

Mobile terminals that support audio applications are becoming increasingly popular and, consequently, there is a growing demand for various voice and/or audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via FM broadcast communication, for example.

Wireless devices may utilize a direct digital frequency synthesizer (DDFS) in signal processing operations relating to transmission and reception of signals. A DDFS is a digitally-controlled signal generator that may vary the output signal frequency over a large range of frequencies, based on a single fixed-frequency precision reference clock. In addition, a DDFS is also phase-tunable. In essence, within the DDFS, discrete amplitude levels are input to a digital-to-analog converter (DAC) at a sampling rate determined by the fixed-frequency reference clock. The output of the DDFS may provide a signal whose shape may depend on the sequence of discrete amplitude levels that are input to the DAC at the constant sampling rate. The DDFS is particularly well suited as a frequency generator that outputs a sine or other periodic waveforms over a large range of frequencies, from almost DC to approximately half the fixed-frequency reference clock frequency.

A DDFS offers a larger range of operating frequencies and requires no feedback loop, thereby providing near instantaneous phase and frequency changes, avoiding overshooting, undershooting and settling time issues associated with other analog systems. A DDFS may provide precise digitally-controlled frequency and/or phase changes without signal discontinuities.

Integrating multiple audio communication technologies into a single device, while seemingly desirable, may be costly. Combining a plurality of different communication services into a portable electronic device or a wireless device may require separate processing hardware and/or separate processing software. Moreover, coordinating the reception and/or transmission of data to and/or from the portable electronic device or a wireless device that uses FM transceivers may require significant processing overhead that may impose certain operation restrictions and/or design challenges. In addition, simultaneous use of a plurality of radios in a handheld may result in significant increases in power consumption. Power being a precious commodity in most wireless mobile devices, combining devices such as a Bluetooth radio and a FM radio requires careful design and implementation in order to minimize battery usage. Additional overhead such as sophisticated power monitoring and power management techniques are required in order to maximize battery life.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for enabling simultaneous FM transmitter and FM receiver functions using an integrated Bluetooth Local Oscillator Generator (LOGEN), substantially as shown in and/or described in connection with at least one of the figures, as set forth more completely in the claims.

These and other advantages, aspects and novel features of the present invention, as well as details of an illustrated

DETAILED DESCRIPTION OF THE INVENTION

Certain embodiments of the invention may be found in a method and system for enabling simultaneous FM transmitter and FM receiver functions using an integrated Bluetooth Local Oscillator Generator (LOGEN). Aspects of the method may comprise utilizing a LOGEN to generate a Bluetooth® signal that comprises (I) and (Q) components for use in Bluetooth® communication. The LOGEN may comprise a Voltage Controlled Oscillator (VCO), which may be enabled to generate signals, for example, in the 1.6 GHz range. These (I) and (Q) components may be referred to as Bluetooth® local oscillator (LO) signals. The Bluetooth® LO signals may have to be, for example, in the 2.4 GHz range, and as such, dividers and/or mixers may be utilized to generate the Bluetooth® signals from the VCO 1.6 GHz signals. The VCO signals may also be utilized to clock two digital frequency synthesizers (DDFS) to generate FM radio (I) and (Q) LO signals for FM radio reception and/or transmission. The two DDFS may be clocked directly from the VCO 1.6 GHz signal, or from the output signal of a signal divider generating a signal in the 800 MHz range. The LOGEN signal may be kept at the same frequency, or reduced in frequency, for use in clocking the two FM DDFS.

The outputs of each DDFS may be a constant frequency while the inputs to each DDFS may vary in frequency. For example, while the Bluetooth® LO signal may vary in frequency as Bluetooth® frequency hopping occurs, the FM LO signals may remain constant for a specific channel frequency. The DDFS may be controlled by one or more frequency words, which may be generated by one or more processors or controllers.

Figure 1:
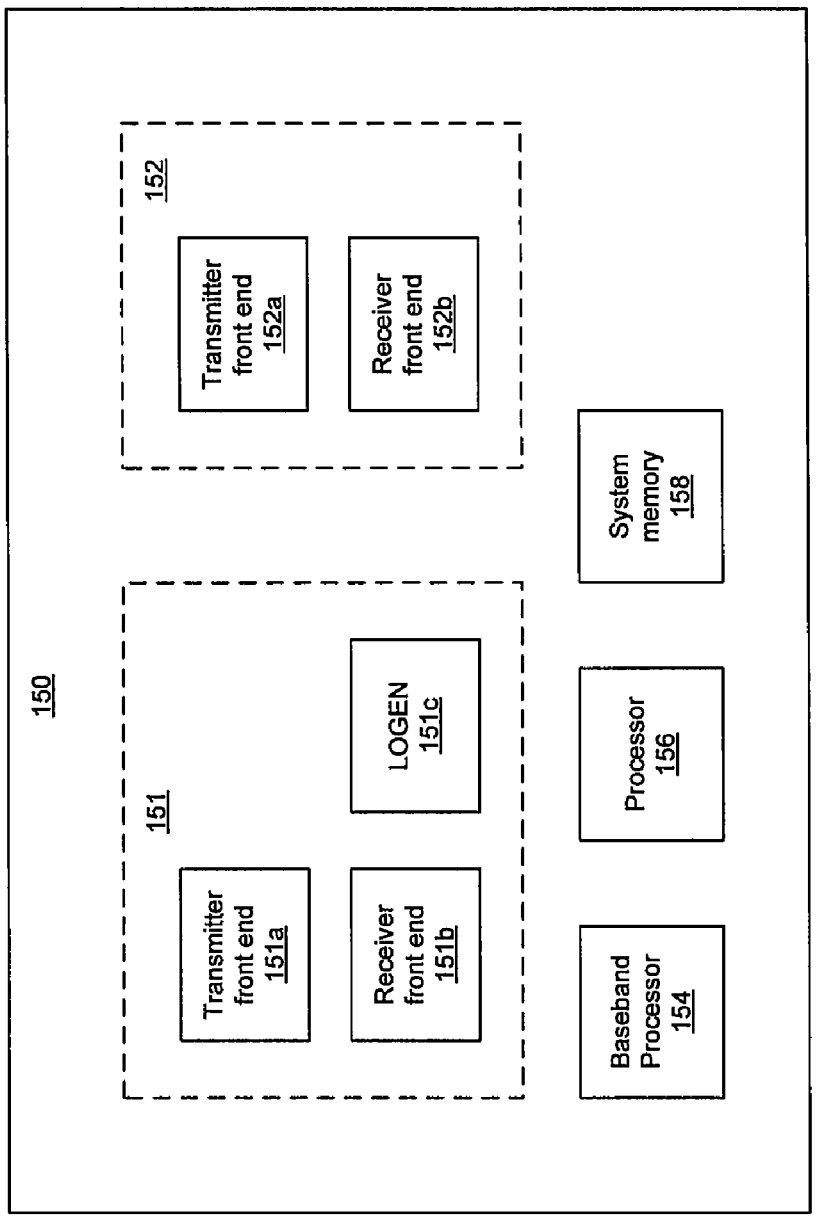
FIG. 1 is a block diagram of an exemplary system for wireless communication using a plurality of communication protocols, which may be utilized in accordance with an embodiment of the invention.

FIG. 1 is a block diagram of an exemplary system for wireless communication using a plurality of communication protocols, which may be utilized in accordance with an embodiment of the invention. Referring to FIG. 1, there is shown a mobile terminal 150 comprising a plurality of transceivers 151 and 152, a baseband processor 154, a processor 156, and system memory 158. The transceivers 151 and 152 may each comprise a transmitter front end 151a, 152a, respectively, and a receiver front end 151b, 152b, respectively. Transceiver 151 may additional comprise a Local Oscillator Generator (LOGEN) 151c.

The transmitter front ends 151a and 152a may comprise suitable logic, circuitry, and/or code that may be adapted to process and transmit RF signals. The antennas that may be used to transmit the signals are not shown. The transmitter front ends 151a and 152a may be communicated baseband signals to be transmitted from a baseband processor, such as, for example, the baseband processor 154. The signals may then be, for example, filtered, amplified, unconverted, and/or modulated for transmission. The baseband signal may be analog or digital depending on the functionality of the transmitter front end 151a or 152a and the baseband processor 154.

The receiver front ends 151b and 152b may comprise suitable logic, circuitry, and/or code that may be adapted to receive and process RF signals. The antennas that may be used to receive the signals are not shown. The receiver front ends 151b and 152b may amplify, filter, downconvert, and/or demodulate the received signals to generate a baseband signal. The baseband signal may be analog or digital depending on the functionality of the receiver front end 151b or 152b and the baseband processor 154

The LOGEN 151c may comprise suitable logic, circuitry, and/or code that may enable generating clock signals that may be utilized in RF transmission and/or reception.

The baseband processor 154 may comprise suitable logic, circuitry, and/or code that may be adapted to process received baseband signals from the receiver front ends 151b and 152b. The baseband processor 154 also may comprise suitable logic, circuitry, and/or code that may be adapted to process a baseband signal for communication to the transmitter front ends 151a and 152a. Although the baseband processor 154 may be depicted as a single block, the invention need not be so limited. Accordingly, other embodiments of the invention may comprise a plurality of baseband processors for processing signals to and/or from the transceivers 151 and 152. The baseband processor 154 may be utilized to generate control words that may be utilized to control the DDFS. The baseband processor 154 may also be utilized to determine the scale factors for signal dividers that may be utilized in clock signal derivations. These derived clock signals may be utilized to clock FM transmit, FM receive, and/or Bluetooth transmit and Bluetooth receive functions.

The processor 156 may comprise suitable logic, circuitry, and/or code that may be adapted to control the operations of the transceivers 151 and 152 and/or the baseband processor 154. For example, the processor 156 may be utilized to update and/or modify programmable parameters and/or values in a plurality of components, devices, and/or processing elements in the transceivers 151 and 152 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

The processor 156 may utilize the received control and/or data information to determine a mode of operation for the transceivers 151 and/or 152. For example, the processor 156 may control each of the receiver front ends 151b and 152b to receive RF signals at a specific frequency. Similarly, the processor 156 may control each of the transmitter front ends 151a and 152a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the controller/processor 156. This information stored in system memory 158 may be transferred to the receiver front end 152 from the system memory 158 via the controller/processor 156. The system memory 158 may comprise suitable logic, circuitry, and/or code that may be adapted to store a plurality of control and/or data information, including parameters needed to calculate frequencies and/or gain, and/or the frequency value and/or gain value. The processor 156 may be utilized to generate control words that may be utilized to control the DDFS.

In operation, the mobile terminal 150 may enable two simultaneous RF communications. The plurality of transceivers, 151 and 152, may enable performing RF transmission and/or reception operations pertaining to different interfaces at the same time. For example, the mobile terminal 150 may be utilized to support simultaneous Bluetooth® and FM. The transceiver 151 may be utilized to support Bluetooth® communication, and the transceiver 152 may be utilized to support the FM transmit and receive functions. The processor 156, baseband processor 154, and system memory 158 may be utilized to control and support the two simultaneous RF communications, for example Bluetooth® and FM, by providing necessary control and data the may enable the plurality of the transceivers, 151 and 152, to perform RF transmission and/or reception. The LOGEN 151c may be utilized for generating clock signaling necessary for RF transmission and/or reception, for example Bluetooth®, in transceiver 151. Furthermore, the LOGEN 151c may also be utilized to simultaneously generate clock signaling for a second RF transmission and/or reception, for example FM, in transceiver 152. The processor 156, baseband processor 154, and system memory 158 may be utilized to control and support such clock signaling operations. For example, the processor 156 and/or baseband processor 154 may be utilized to control direct digital frequency synthesizers that may be utilized in clock signal generation and derivation operations; also, the processor 156 and/or baseband processor 154 may be utilized to provide any necessary scale factors for signal dividers that may be utilized in clock signal derivations.

Figure 2A:
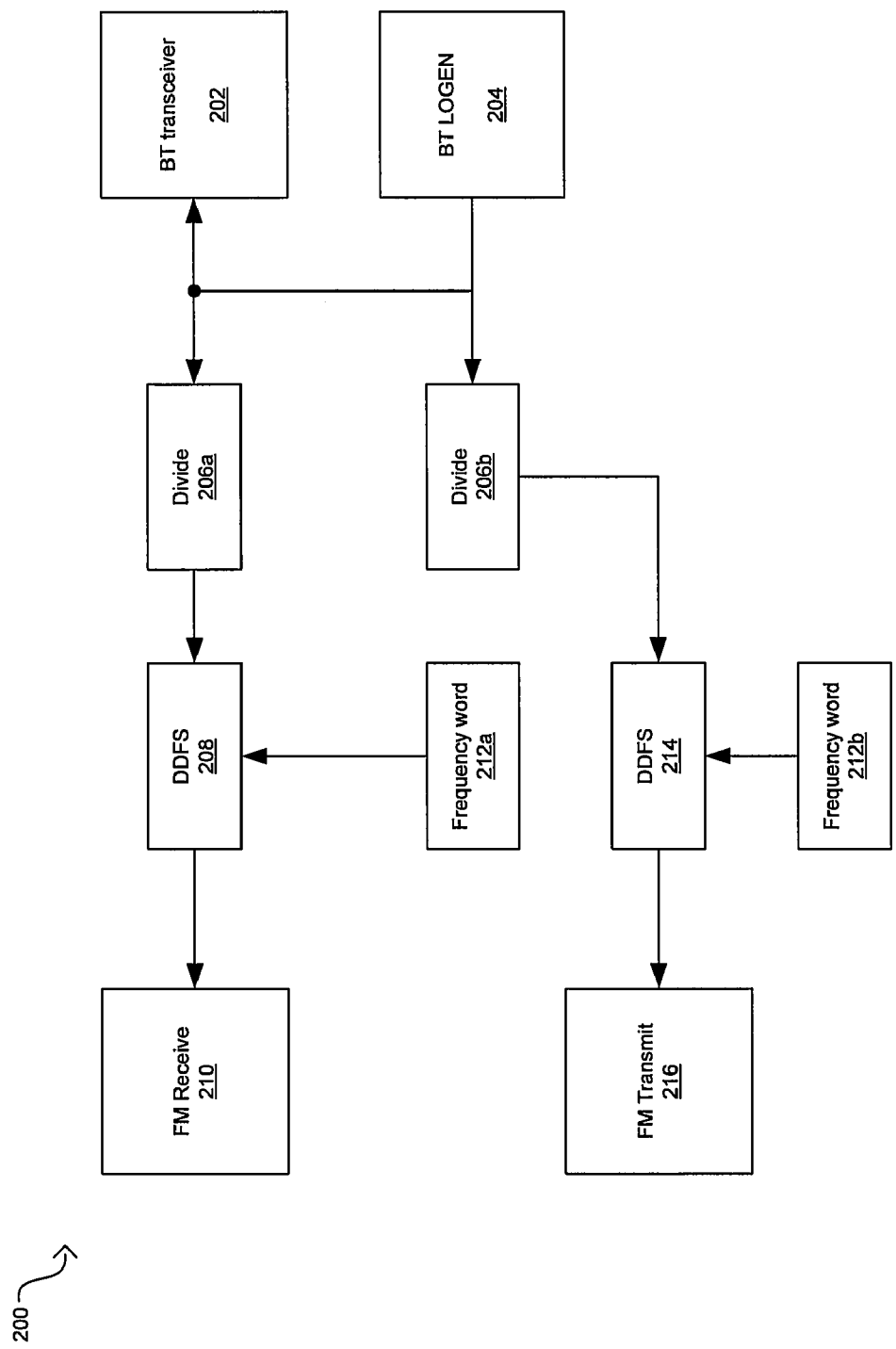
FIG. 2A is a block diagram of an exemplary system for wireless communication using a single BT LOGEN to clock the BT and FM transceivers, which may be utilized in accordance with an embodiment of the invention.

FIG. 2A is a block diagram of an exemplary system for wireless communication using a single BT LOGEN to clock the BT and FM transceivers, which may be utilized in accordance with an embodiment of the invention. Referring to FIG. 2, there is shown a wireless terminal 200 comprising a BT transceiver 202, a BT LOGEN 204, a divider block 206a, a divider block 206b, a DDFS 208, a DDFS 214, an FM receiver 210, a frequency word control block 212a, a frequency word control block 212b, and an FM transmitter 216.

The BT transceiver 202 may comprise suitable logic, circuitry, and/or code that may enable reception and transmission of Bluetooth® signals. The BT transceiver 202 may be similar, for example, to the transceiver 151 and/or 153. Accordingly, the BT transceiver 202 may transmit and receive RF signals at frequencies used for Bluetooth® communication. The BT LOGEN 204 may comprise suitable logic and/or circuitry that may enable generation of a desired local oscillator (LO) signal for use by, for example, a transceiver, such as the BT transceiver 202. The BT LOGEN 204 may generate a plurality of LO signals with the same frequency, but different phases. For example, the BT LOGEN 204 may generate (I) and (Q) signals for use by the Bluetooth® transceiver 202. General operation of a PLL is described in more detail with respect to FIG. 2B and FIG. 2C.

The FM receiver 210 may comprise suitable logic, circuitry, and/or code that may enable reception of RF signals at FM radio spectrum. The FM transmitter 216 may comprise suitable logic, circuitry, and/or code that may enable transmission of RF signals at FM radio spectrum.

The divider block 206a may comprise suitable logic, circuitry, and/or code that may enable reducing a frequency of an input signal to an output signal with a desired frequency. The output signal generated by the divider block 206a may be used, for example, as a reference clock for the DDFS 208. The divider block 206a may receive a signal from the BT LOGEN 204 having a frequency $F_{in}$, and output a signal having a frequency $F_{DIV\_FM\_Rx} = F_{in}/N_{FM\_Rx}$, wherein $N_{FM\_Rx}$ may represent a configurable scale factor utilized by the divider block 206a.

The divider block 206b may comprise similar to divider bock 206a. The output signal generated by the divider block 206b may be used, for example, as a reference clock for the DDFS 214. The divider block 206a may receive a signal from the BT LOGEN 204 having a frequency $F_{in}$, and output a signal having a frequency $F_{DIV\_FM\_Tx} = F_{in}/N_{FM\_Tx}$, wherein $N_{FM\_Tx}$ may represent a configurable scale factor utilized by the divider block 206a.

The DDFS 208 may generate at least one output signal that may be used as a LO signal for transmission and reception of RF signals by the FM transmitter 210. The DDFS 208 may be utilized to generate, for example, (I) and (Q) LO signals for use by the FM receiver 210. The frequency word control block 212a may comprise suitable logic, circuitry, and/or code that may enable generation of frequency word controls for the DDFS 208. The frequency word controls may be used by the DDFS 208 to determine the frequency and/or phase of the output signals of the DDFS 208. The frequency word control block 212a may vary the frequency word controls to the DDFS 208 depending on the frequency of the input signal and the desired output frequency.

The DDFS 214 and frequency word control block 212b may be comprised similar to the DDFS 208 and frequency word control block 212a, and operate in similar manner in conjunction with the FM transmitter 216.

In operation, the BT LOGEN 204 may be utilized to generate appropriate LO signals that may be used for the Bluetooth® transceiver 202. The LO signals generated by the BT LOGEN 204 may be used for frequency hopping by the Bluetooth® transceiver 202. Accordingly, frequencies of the (I) and O signals may vary. The signal from the BT LOGEN 204 may be divided by the divider blocks 206a and 206b using appropriate scale factors, for example $N_{FM\_Rx}$ and $N_{FM\_Tx}$, such that it may be an appropriate reference clock signal for the DDFS 208 and the DDFS 214. The scale factors may be determined by, for example, a processor such as the baseband processor 154 and/or the processor 156.

The signal from the divider block 206a may be communicated to the DDFS 208 as a reference clock. Since the input to the divider block 206a may change as the BT transceiver 202 engages in frequency hopping, the output of the divider block 206a may also change frequencies. Accordingly, the frequency word control block 212a may vary the frequency word control to compensate for the changing input reference clock. Similarly, the frequency word control block 212b may vary the frequency word control to compensate for the changing input reference clock inputted into the DDFS 214 from the divider block 206b as a result of variations caused by Bluetooth® hopping. Other embodiments of the invention may also control the divider blocks 206a and 206b to change the frequency of its output signal. Accordingly, the DDFS 208 and the DDFS 214 may output a desired frequency by controlling the frequency of the input reference clock signal and the value of the frequency word control. The digital signals generated by the frequency word control block 212a and the frequency word control block 212b may comprise control information about the frequency and/or phase of the analog output signal that may be generated by the DDFS 208 and 214. The processor 156 and/or processor 154 may also be utilized to control the DDFSs 208, 214, so as to provide necessary data that may enable the DDFSs 208 and/or 214 to perform necessary frequency synthesis, and scale factors utilized by divider 206a and/or 206b.

While each block in FIG. 2 may show a single output signal for simplicity and ease of explanation, the invention need not be so limited. For example, the BT LOGEN 204 may output (I) and (Q) signals for the BT transceiver 204. Similarly, the outputs of the DDFS 208 and 214 may comprise (I) and (Q) signals for the FM receiver 210 and the FM transmitter 216, respectively. The input to the divider block 206a and 206b may be, for example, one of the (I) and (Q) signals. Similarly, the DDFS 208 may generate (I) and (Q) signals for the FM receiver 210, and the DDFS 214 may generate (I) and (Q) signals for the FM transmitter 216.

Additionally, while the divider block 206a and the divider block 206b may be shown in an embodiment of the invention disclosed with respect to FIG. 2, the invention need not be so limited. For example, a signal that has the same frequency as the output of the BT LOGEN 204 may be used as a reference clock for the DDFS 208 and the DDFS 214.

Figure 2B:
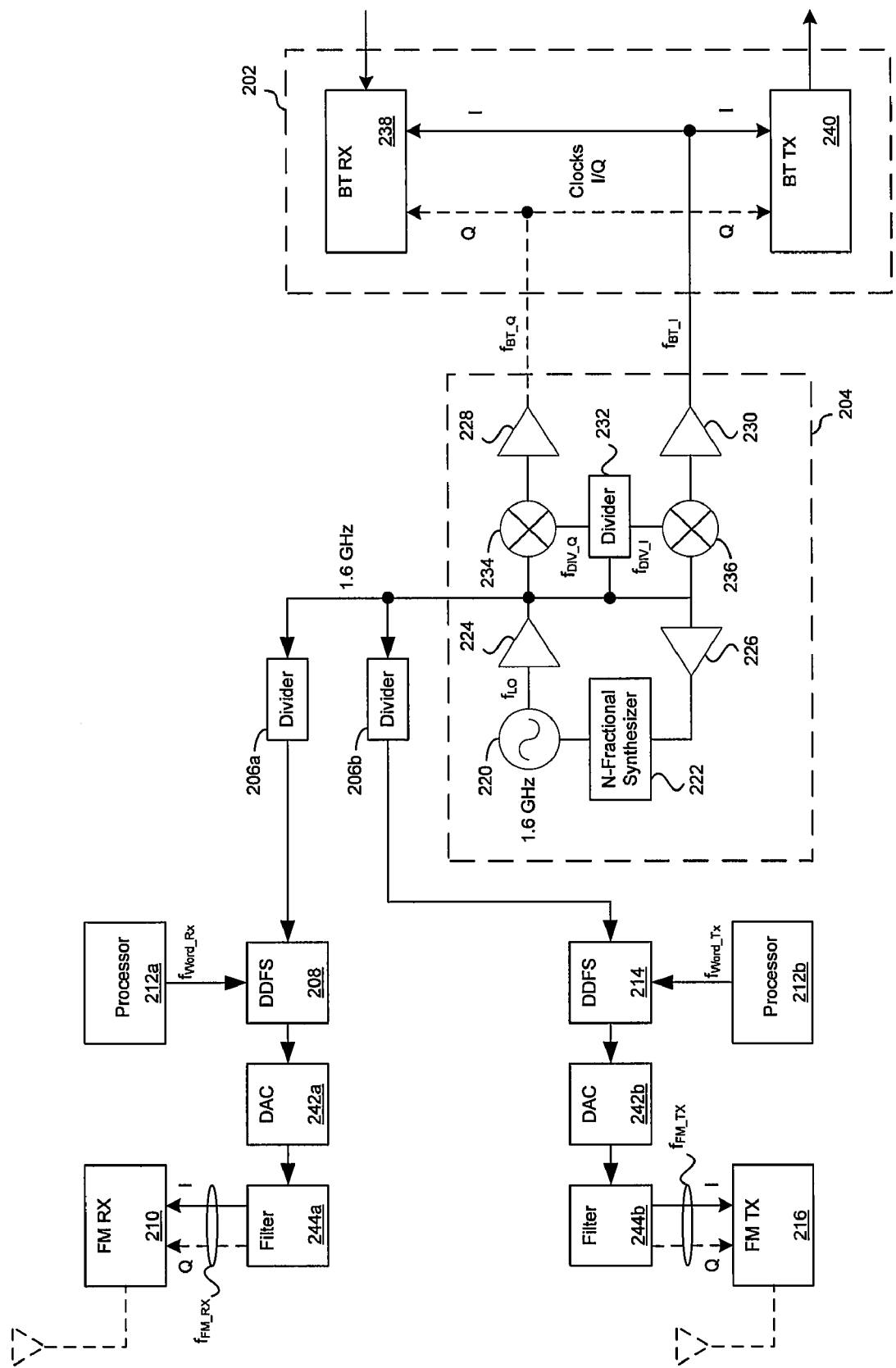
FIG. 2B is a block diagram of an exemplary system for wireless communication using a integrated BT LOGEN to clock the BT and clock FM transceiver at 1.6 GHz, which may be utilized in accordance with an embodiment of the invention.

FIG. 2B is a block diagram of an exemplary system for wireless communication using a integrated BT LOGEN to clock the BT and clock FM transceiver at 1.6 GHz, which may be utilized in accordance with an embodiment of the invention. Referring to FIG. 2B, there is shown BT transceiver 202, the BT LOGEN 204, the divider block 206a, the divider block 206b, the DDFS 208, the DDFS 214, the FM receiver 210, the frequency word control block 212a, the frequency word control block 212b, the FM transmitter 216, a digital to analog converter (DAC) 242a, a digital to analog converter (DAC) 242b, a filter 244a, and a filter 244b. The BT transceiver 202 may comprise a Bluetooth (BT) receiver 238 and a Bluetooth (BT) transmitter 240. The BT LOGEN 204 may comprise a voltage controlled oscillator (VCO) 220, a fractional synthesizer 222, a plurality of loop amplifiers 224, 226, 228, and 230, a plurality of mixers 232 and 234, and a divider 232.

The BT LOGEN 204 may comprise suitable logic, circuitry, and/or code that may be enabled to generate a quadrature clock signal $f_{BT}$ comprising an in-phase (I) component $f_{BT\_I}$ and a quadrature-phase (Q) component $f_{BT\_Q}$. The (I) and (Q) component signals may be communicated to the BT receiver 238 and the BT transmitter 240. The frequency of the generated quadrature clock signal $f_{BT}$ to the BT receiver 238 and the BT transmitter 240 may be about 2.4 GHz, for example, and may be enabled to clock one or more of the BT receiver 238 and the BT transmitter 240. The BT LOGEN 204 may also be utilized to generate an (I) and (Q) component output signals for FM transmission and reception frequencies $f_{FM\_Tx}$ and $f_{FM\_Rx}$. The frequency of the generated quadrature clock signals $f_{FM\_Rx}$ and $f_{FM\_Tx}$ to the FM receiver 232 and the FM transmitter 230 may be in the range of 78-100 MHz, for example, and may be enabled to clock one or more of the FM receiver 232 and the FM transmitter 230.

The VCO 220 may comprise suitable logic, circuitry, and/or code that may be enabled to generate a clock signal $f_{LO}$ at a particular frequency that may be N times the frequency of the reference oscillator, $Nf_0$, for example, where $f_0$ is the frequency of the reference oscillator. For example, the VCO 220 may be enabled to generate a 1.6 GHz clock signal.

The loop amplifier 216 may comprise suitable logic, circuitry, and/or code that may be enabled to amplify the generated clock signal $f_{LO}$ received from the VCO 220. The loop amplifier 224 may comprise suitable logic, circuitry, and/or code that may be enabled to generate an amplified output signal to the plurality of mixers 234 and 236, and the divider 232. The loop amplifier 226 may comprise suitable logic, circuitry, and/or code that may be enabled to amplify a received signal from the loop amplifier 224 and generate an amplified output signal to the fractional synthesizer 222.

The fractional synthesizer 222 may comprise suitable logic, circuitry, and/or code that may be enabled to divide the output of the VCO 220 by N, for example, to match the frequency of a reference oscillator. The fractional synthesizer 222 may be programmable to synthesize a plurality of closely spaced frequencies, which enables it to be utilized in commercial wireless applications with multiple channels. In an embodiment of the invention, the fractional synthesizer 222 may be enabled to adjust a clock signal $f_{LO}$ generated by the VCO 220 without affecting the quadrature clock signals $f_{BT}$ communicated to the Bluetooth transceiver 204.

The divider 232 may comprise suitable logic, circuitry, and/or code that may be enabled to divide a frequency of a received input signal into one or more signals with different frequencies. For example, the divider 232 may be enabled to receive a 1.6 GHz input signal from the loop amplifier 224 and generate two 800 MHz output signals, for example, to the plurality of mixers 234 and 236. The divider 232 may be enabled to generate an output clock signal $f_{DIV}$ by dividing a frequency of the generated clock signal $f_{LO}$.

The mixer 234 may comprise suitable logic, circuitry, and/or code that may be enabled to mix the received input signals from the loop amplifier 224 and the divider 232 and generate an output signal to the loop amplifier 228. For example, the mixer 234 may be enabled to mix a 1.6 GHz input signal from the loop amplifier 224 and a 800 MHz input signal from the divider 232 and generate a 2.4 GHz output signal to the loop amplifier 228. The loop amplifier 228 may be enabled to amplify the received input signal from the mixer 234 and generate an amplified output signal to one or more of the BT receiver 238 and the BT transmitter 240. For example, the loop amplifier 228 may be enabled to generate the (Q) component $f_{BT\_Q}$ of the amplified output signal to one or more of the BT receiver 238 and the BT transmitter 240.

The mixer 236 may comprise suitable logic, circuitry, and/or code that may be enabled to mix the received input signals from the loop amplifier 224 and the divider 232 and generate an output signal to the loop amplifier 230. For example, the mixer 236 may be enabled to mix a 1.6 GHz input signal from the loop amplifier 224 and a 800 MHz input signal from the divider 232 and generate a 2.4 GHz output signal to the loop amplifier 230. The loop amplifier 230 may be enabled to amplify the received input signal from the mixer 236 and generate an amplified output signal to one or more of the BT receiver 238 and the BT transmitter 240. For example, the loop amplifier 230 may be enabled to generate the (I) component $f_{BT\_I}$ of the amplified output signal to one or more of the BT receiver 238 and the BT transmitter 240.

In operation, the fractional synthesizer 222 may be enabled to generate a control signal, which may be utilized by the VCO 220 to generate a clock signal $f_{LO}$. In an exemplary embodiment of the invention, the frequency of the clock signal, $f_{LO}$, may be about 1.6 GHz. The fractional synthesizer 222 may utilize the clock signal, $f_{LO}$ to adjust a subsequent control signal communicated to the VCO 220. The clock signal, $f_{LO}$, may be communicated to a divider 232, which may implement frequency division on the received signal $f_{LO}$. The divider 232 may generate an output clock signal, $f_{DIV}$ comprising in-phase (I) component frequency division signal, $f_{DIV\_I}$, and a quadrature-phase (Q) component frequency division signal, $f_{DIV\_Q}$. In an exemplary embodiment of the invention:

$$f_{DIV\_I} = f_{DIV\_Q} = \frac{f_{LO}}{2} \quad [1]$$

The mixer 236 may be enabled to mix the signals, $f_{LO}$ and $f_{DIV\_I}$, and generate a signal $f_{BT\_I}$. The mixer 234 may mix the signals, $f_{LO}$ and $f_{DIV\_Q}$, and generate a signal $f_{BT\_Q}$. In an exemplary embodiment of the invention, the frequencies of the signals $f_{BT\_I}$ and $f_{BT\_Q}$ may be represented as follows:

$$f_{BT\_I} = f_{LO} + f_{DIV\_I} \quad [2]$$

and $$f_{BT\_Q} = f_{LO} + f_{DIV\_Q} \quad [3]$$

The signals $f_{BT\_I}$ and $f_{BT\_Q}$ may be communicated to the BT receiver 238 and/or to the BT transmitter 240. In an exemplary embodiment of the invention, the frequency of the signals $f_{BT\_I}$ and $f_{BT\_Q}$ may be about 2.4 GHz.

In an embodiment of the invention, the clock signal $f_{LO}$ may be communicated to the divider blocks 206a and 206b, where clock signal may be reduced by a control factor as described above. The clock signal $f_{LO}$ may also be communicated directly to the DDFS 208 and 214. The DDFS 208 and 214 may be enabled to receive a clock signal, which may either be the clock signal $f_{LO}$ or the output signals from the divider blocks 206a and 206b respectively, and generate a sequence of binary numbers. The process of converting the DDFS input signal to a sequence of binary numbers may comprise analog to digital conversion (ADC) whereby each distinct voltage, current and/or power level associated with the received clock signal may be represented as a binary number selected from a plurality of binary numbers. Conversely, each binary number may correspond to a range of voltage, current and/or power levels in the received clock signal. An exemplary clock signal, $f_{LO}$ may be a sinusoidal signal for which the corresponding period may be equal to the inverse of the frequency, $(1/f_{LO})$. The number of binary numbers in the plurality may be determined by the number of bits, b, in the binary number representation. Each binary number may comprise a least significant bit (LSB) and a most significant bit (MSB). In an exemplary numerical representation, each of binary numbers may have a value within the range 0 to $2^b-1$. The operation of the DDFS 208 may be such that a period of the received clock signal, $f_{LO}$ may be converted to a binary sequence 0, 1, . . . , $2^b-1$, wherein upon reaching the value $2^b-1$ the next number in the binary sequence may be 0 with the sequence continuing. The set of numbers from 0 to $2^b-1$ may represent a period of the binary sequence. The DDFS 208 may receive a frequency word control input signal, $f_{Word\_Rx}$, from the processor 212a upon which the value of b may be determined. Consequently, the period of the sequence of binary numbers generated by the DDFS may be programmable based on the $f_{Word\_Rx}$ input signal. The DDFS 214 may operate in similar manner wherein the processor 212b may communicate another frequency word control input signal $f_{Word\_Tx}$ that is specifically configured to desired frequency from FM transmission.

The DAC 242a and 242b may comprise suitable logic, circuitry and/or code that may enable generation of an analog output signal based on a received sequence of input binary numbers. The DAC 242a and 242b may be enabled to generate corresponding analog voltage levels for each input binary number. The number of distinct analog voltage levels may be equal to the number of distinct binary numbers in the input sequence.

The filter 244a may comprise suitable logic, circuitry and/or code that may enable low pass filtering (LPF) of signal components contained in a received input signal. The filter 244a may enable smoothing of the received input signal to attenuate amplitudes for undesirable frequency components contained in the received input signal. The filter 244a may generate a signal, $f_{FM\_Rx}$, having a frequency in the FM frequency band. In an exemplary embodiment of the invention, the range of frequencies for the signal $f_{FM\_Rx}$ may be between about 78 MHz and 100 MHz, for example. The signal $f_{FM\_Rx}$ may be a quadrature signal comprising (I) and (Q) signal components. The 78-100 MHz (I) and (Q) signals may be communicated to an FM receiver 210. The filter 244b may be similar to 244a, and may be utilized in similar manner to generate a signal $f_{FM\_Tx}$, having a frequency in the FM frequency band. In an exemplary embodiment of the invention, the range of frequencies for the signal $f_{FM\_Tx}$ may be between about 78 MHz and 100 MHz, for example. The signal $f_{FM\_Tx}$ may be a quadrature signal comprising (I) and (Q) signal components. The 78-100 MHz (I) and (Q) signals may be communicated to an FM transmitter 210. The FM frequencies $f_{FM\_Rx}$ and $f_{FM\_Tx}$ may be different.

In operation, the value $f_{Word\_Tx}$ and $f_{Word\_Rx}$ may be selected to maintain an approximately constant frequency for the signals $f_{FM\_Rx}$ and $f_{FM\_Tx}$ despite changes that may occur in the signal $f_{LO}$, which may occur due to frequency hopping in the Bluetooth communication signal.

Figure 2C:
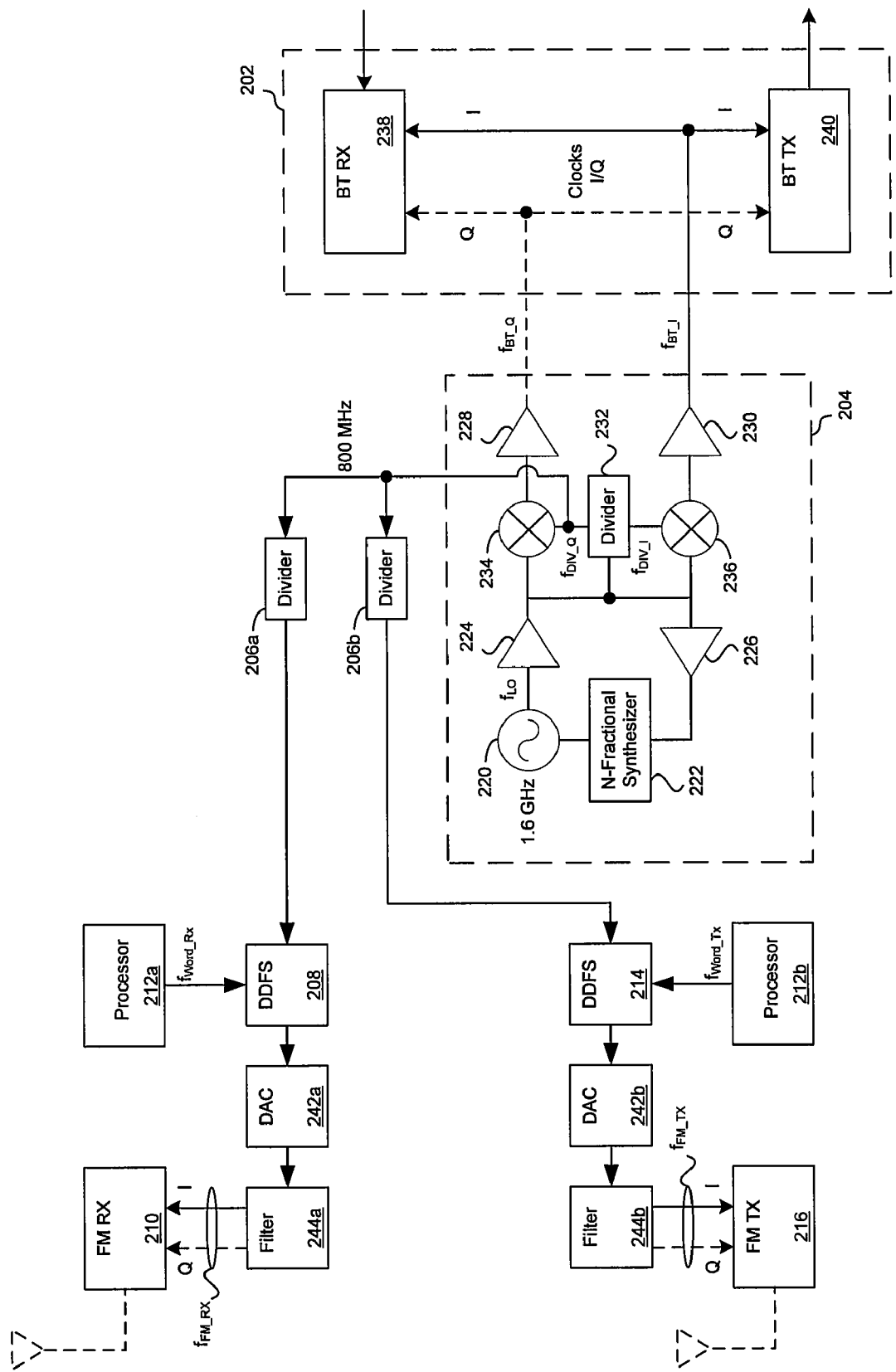
FIG. 2C is a block diagram of an exemplary system for wireless communication using a integrated BT LOGEN to clock the BT and clock FM transceiver at 800 MHz, which may be utilized in accordance with an embodiment of the invention.

FIG. 2C is a block diagram of an exemplary system for wireless communication using a integrated BT LOGEN to clock the BT and clock FM transceiver at 800 MHz, which may be utilized in accordance with an embodiment of the invention. Referring to FIG. 2C, there is shown the BT transceiver 202, the BT LOGEN 204, the divider block 206a, the divider block 206b, the DDFS 208, the DDFS 214, the FM receiver 210, the frequency word control block 212a, the frequency word control block 212b, the FM transmitter 216, the digital to analog converter (DAC) 242a, the digital to analog converter (DAC) 242b, the filter 244a, and a filter 244b. The BT transceiver 202 may comprise the Bluetooth (BT) receiver 238 and the Bluetooth (BT) transmitter 240. The BT LOGEN 204 may comprise the voltage controlled oscillator (VCO) 220, the fractional synthesizer 222, the plurality of loop amplifiers 224, 226, 228, and 230, the plurality of mixers 232 and 234, and the divider 232.

The components may be substantially similar to the corresponding components described with respect to FIG. 2B. However, rather than utilizing the clock signal $f_{LO}$ in generating FM frequencies $f_{FM\_Rx}$ and $f_{FM\_Tx}$, the signal $f_{DIV\_I}$ or the signal $f_{DIV\_Q}$ may be utilized instead.

In an embodiment of the invention, the clock signal $f_{DIV\_Q}$ may be communicated to the divider blocks 206a and 206b. The clock signal $f_{DIV\_Q}$ may also be communicated directly to the DDFS 208 and 214. The DDFS 208 and 214 may be enabled to receive a clock signal, which may either be the clock signal $f_{DIV\_I}$ the output signals from the divider blocks 206a and 206b respectively, and generate a sequence of binary numbers.

The process of converting the DDFS input signal to a sequence of binary numbers may comprise analog to digital conversion (ADC) whereby each distinct voltage, current and/or power level associated with the received clock signal may be represented as a binary number selected from a plurality of binary numbers. Conversely, each binary number may correspond to a range of voltage, current and/or power levels in the received clock signal. An exemplary clock signal, $f_{LO}$ may be a sinusoidal signal for which the corresponding period may be equal to the inverse of the frequency, $(1/f_{DIV\_Q})$. The number of binary numbers in the plurality may be determined by the number of bits, b, in the binary number representation. Each binary number may comprise a least significant bit (LSB) and a most significant bit (MSB). In an exemplary numerical representation, each of binary numbers may have a value within the range 0 to $2^b-1$. The operation of the DDFS 208 may be such that a period of the received clock signal, $f_{LO}$ may be converted to a binary sequence 0, 1, . . . , $2^b-1$, wherein upon reaching the value $2^b-1$ the next number in the binary sequence may be 0 with the sequence continuing. The set of numbers from 0 to $2^b-1$ may represent a period of the binary sequence. The DDFS 208 may receive a frequency word input signal, $f_{Word\_Rx}$, from the processor 212a upon which the value of b may be determined. Consequently, the period of the sequence of binary numbers generated by the DDFS may be programmable based on the $f_{Word\_Rx}$ input signal. The DDFS 214 may operate in similar manner wherein the processor 212b may communicate another $f_{Word\_Tx}$ that is specifically configured to desired frequency from FM transmission.

The DAC 242a and 242b may comprise suitable logic, circuitry and/or code that may enable generation of an analog output signal based on a received sequence of input binary numbers. The DAC 242a and 242b may be enabled to generate corresponding analog voltage levels for each input binary number. The number of distinct analog voltage levels may be equal to the number of distinct binary numbers in the input sequence.

The filter 244a may comprise suitable logic, circuitry and/or code that may enable low pass filtering (LPF) of signal components contained in a received input signal. The filter 244a may enable smoothing of the received input signal to attenuate amplitudes for undesirable frequency components contained in the received input signal. The filter 244a may generate a signal, $f_{FM\_Rx}$, having a frequency in the FM frequency band. In an exemplary embodiment of the invention, the range of frequencies for the signal $f_{FM\_Rx}$ may be between about 78 MHz and 100 MHz, for example. The signal $f_{FM\_Rx}$ may be a quadrature signal comprising (I) and (Q) signal components. The 78-100 MHz (I) and (Q) signals may be communicated to an FM receiver 210. The filter 244b may be similar to 244a, and may be utilized in similar manner to generate a signal $f_{FM\_Tx}$, having a frequency in the FM frequency band. In an exemplary embodiment of the invention, the range of frequencies for the signal $f_{FM\_Tx}$ may be between about 78 MHz and 100 MHz, for example. The signal $f_{FM\_Tx}$ may be a quadrature signal comprising (I) and (Q) signal components. The 78-100 MHz (I) and (Q) signals may be communicated to an FM transmitter 210. The FM frequencies $f_{FM\_Rx}$ and $f_{FM\_Tx}$ may be different.

In operation, the value $f_{Word\_Tx}$ and $f_{Word\_Rx}$ may be selected to maintain an approximately constant frequency for the signals $f_{FM\_Rx}$ and $f_{FM\_Tx}$ despite changes that may occur in the signal $f_{DIV\_Q}$, which may occur due to frequency hopping in the Bluetooth communication signal. Also, because the clock signal used is $f_{DIV\_Q}$ instead of $f_{LO}$, the values used for $f_{Word\_Tx}$ and $f_{Word\_Rx}$ in this embodiment may also be different from the values used in the embodiment described in FIG. 2B.

Figure 2D:
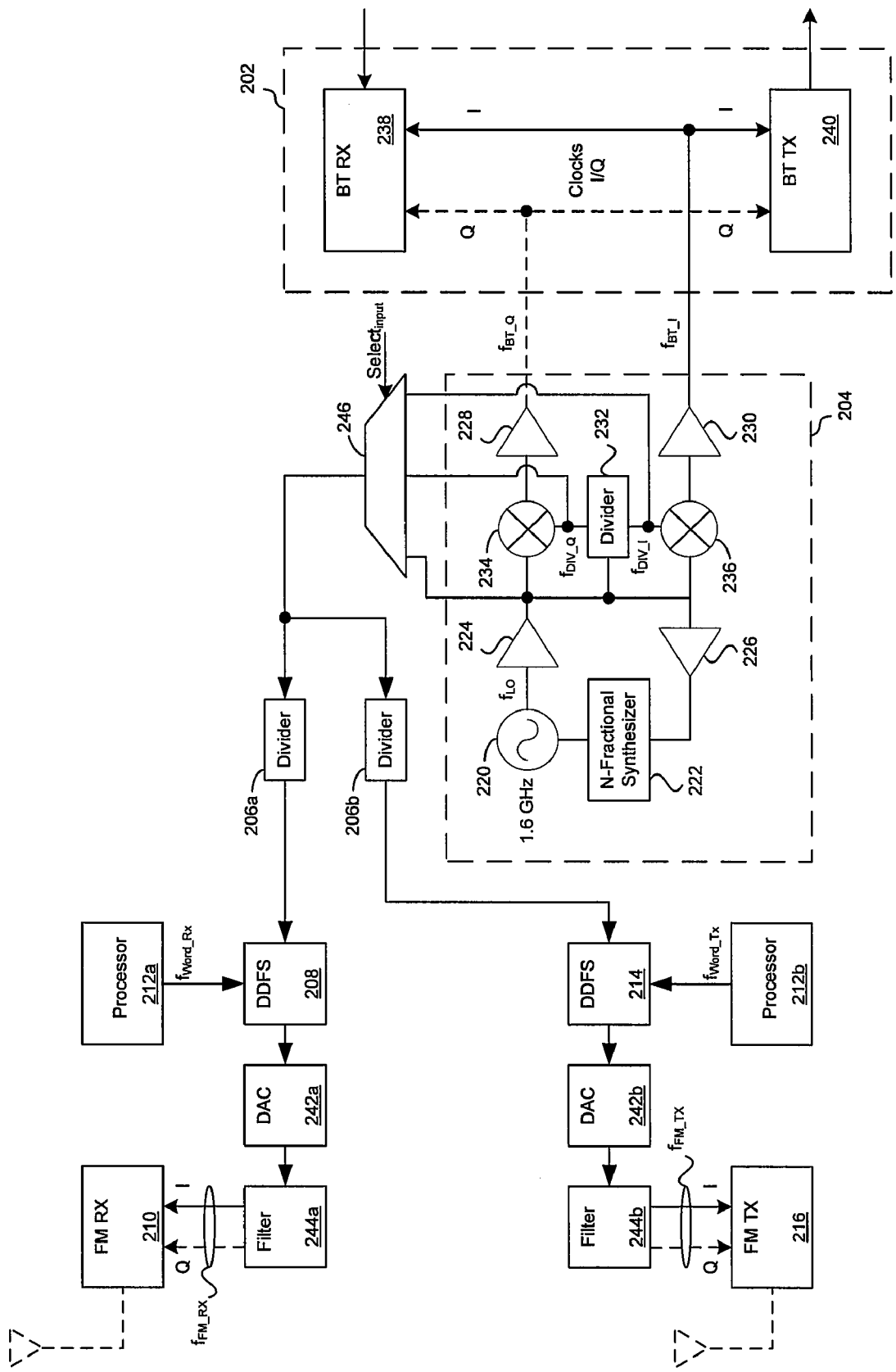
FIG. 2D is a block diagram of an exemplary system for wireless communication using a integrated BT LOGEN to clock the BT and clock FM transceiver via a MUX with plurality of input frequencies, which may be utilized in accordance with an embodiment of the invention.

FIG. 2D is a block diagram of an exemplary system for wireless communication using an integrated BT LOGEN to clock the BT and clock FM transceiver via a MUX with plurality of input frequencies, which may be utilized in accordance with an embodiment of the invention. Referring to FIG. 2D, there is shown the BT transceiver 202, the BT LOGEN 204, the divider block 206a, the divider block 206b, the DDFS 208, the DDFS 214, the FM receiver 210, the frequency word control block 212a, the frequency word control block 212b, the FM transmitter 216, the digital to analog converter (DAC) 242a, the digital to analog converter (DAC) 242b, the filter 244a, the filter 244b, and a multiplexer (MUX) 246. The BT transceiver 202 may comprise the Bluetooth (BT) receiver 238 and the Bluetooth (BT) transmitter 240. The BT LOGEN 204 may comprise the voltage controlled oscillator (VCO) 220, the fractional synthesizer 222, the plurality of loop amplifiers 224, 226, 228, and 230, the plurality of mixers 232 and 234, and the divider 232.

The MUX 246 may comprise suitable logic, circuitry and/or code that may enable outputting a signal which is selected from a plurality of input signals. The other components may be substantially similar to the corresponding components described with respect to FIG. 2B and FIG. 2C.

In operation, $F_{LO}$, $F_{Div\_Q}$ and $F_{Div\_I}$ may be inputted into the MUX 246. The MUX 246 may then receive Select$_{input}$, which may be utilized by the MUX 246 to select an input from the plurality of inputs. The MUX 246 may output a signal by choosing a single from $F_{LO}$, $F_{Div\_Q}$ and $F_{Div\_I}$ based on Select$_{input}$. The output signal from the MUX 246 may be inputted into divider blocks 206a and 206b, and subsequently utilized to clock DDFS 208 and DDFS 214 as described with respect to FIG. 2B. and FIG. 2C.

Figure 3:
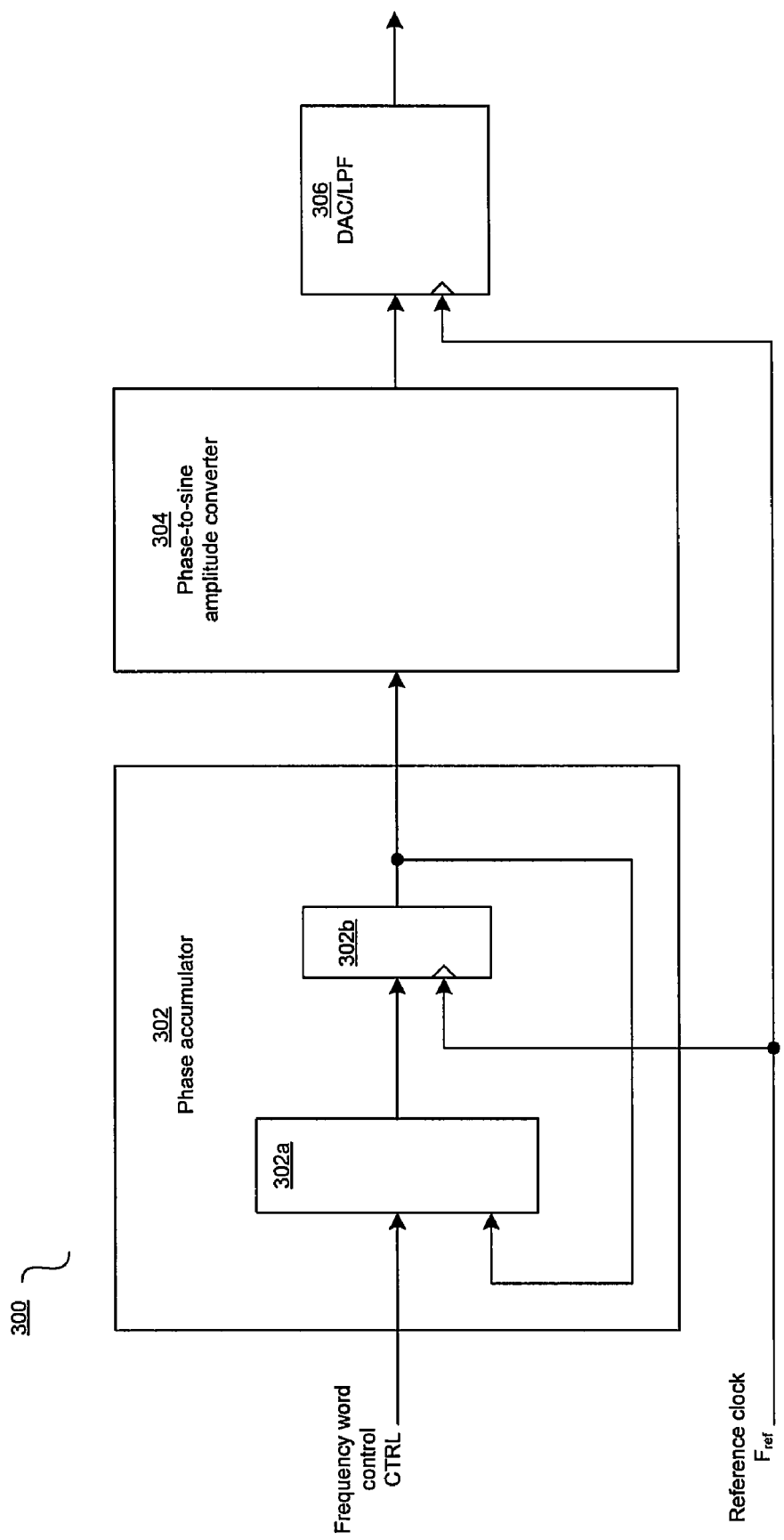
FIG. 3 is a block diagram illustrating an exemplary direct digital frequency synthesizer, which may be utilized in accordance with an embodiment of the invention.

FIG. 3 is a block diagram illustrating an exemplary direct digital frequency synthesizer, which may be utilized in accordance with an embodiment of the invention. Referring to FIG. 3, there is shown a direct digital frequency synthesizer (DDFS) 300 comprising a phase accumulator 302, a phase-to-sine amplitude converter 304, and a digital to analog converter (DAC) 306. The DDFS 300 may be similar in functionality to the DDFS 208 and 214. The phase accumulator 302 may comprise an adder 302a that may enable integrating an input signal, such as, for example, a frequency word control CTRL, by adding it to a previous integrated value stored in a register 302b on each cycle of a reference clock $F_{ref}$. The reference clock $F_{ref}$ may be fixed-frequency or varying frequency. In the case of a varying reference clock $F_{ref}$, the change in frequency may be compensated by altering the frequency word control CTRL such that the output of the DDFS may comprise a desired frequency and/or phase.

The phase-to-sine amplitude converter 304 may comprise suitable logic, circuitry, and/or code that may enable conversion of the output of the phase accumulator 302 to an approximated sine amplitude. For example, the conversion may be achieved via a look-up table. Although only a single output may be shown for exemplary purposes, a plurality of signals may be generated where each signal may be phase shifted from the others. For example, where (I) and (Q) signals may be needed, the phase-to-sine amplitude converter 304 may utilize a plurality of different look-up tables for each input value. In an exemplary embodiment of the invention, a first look-up table may be utilized for the (I) signal and a second look-up table may be utilized for the (Q) signal.

The DAC 306 may comprise suitable logic and/or circuitry that may enable converting the digital output of the phase-to-sine amplitude converter 304 to an analog output. The DAC 306 may also comprise, for example, a low-pass filter that may be used to "smooth" the analog output. Where the DDFS 300 may generate, for example, (I) and (Q) signals, there may be a DAC for generating an (I) signal and a DAC for generating a (Q) signal. Accordingly, the DDFS 300 may be a digitally-controlled signal generator that may vary phase, frequency, and/or amplitude of one or more output signals based on a single reference clock $F_{ref}$ and an input control word, CTRL.

In operation, the input control word, CTRL, may be provided to the adder 302a, and may be successively added to an integrated value stored in the register 302b. The adding may occur, for example, on each cycle of the reference clock $F_{ref}$. In this manner, the sum may eventually be greater than the maximum value the accumulator can store, and the value in the accumulator may overflow or "wrap". Accordingly, an N-bit phase accumulator 302 may overflow at a frequency $F_{out}$ given by the following equation:

$$F_{out}=(F_{ref}*CTRL)/2^N \qquad [2]$$

In this manner, the output of the phase accumulator 302, which may be referred to as $F_{out}$ may be periodic at a period of $1/F_{out}$ and may represent the phase angle of a signal. In this regard, the DDFS 322 may operate as a frequency generator that generates one or more sine waves or other periodic waveforms over a large range of frequencies, from almost DC to approximately half the reference clock frequency $F_{ref}$.

Prior to changing the input control word, CTRL, the state of the DDFS 300 may be saved in, for example, a memory such as the system memory 158, described with respect to FIG. 1A. In this manner, the output signal $F_{out}$ may be interrupted and then resumed without losing the phase information comprising the generated signals. For example, the DDFS 300 may resume generating the output signal $F_{out}$ using the saved state loaded from, for example, the system memory 158. Accordingly, the output signal $F_{out}$ may resume from the last phase angle transmitted before the signal was interrupted.

Figure 4:
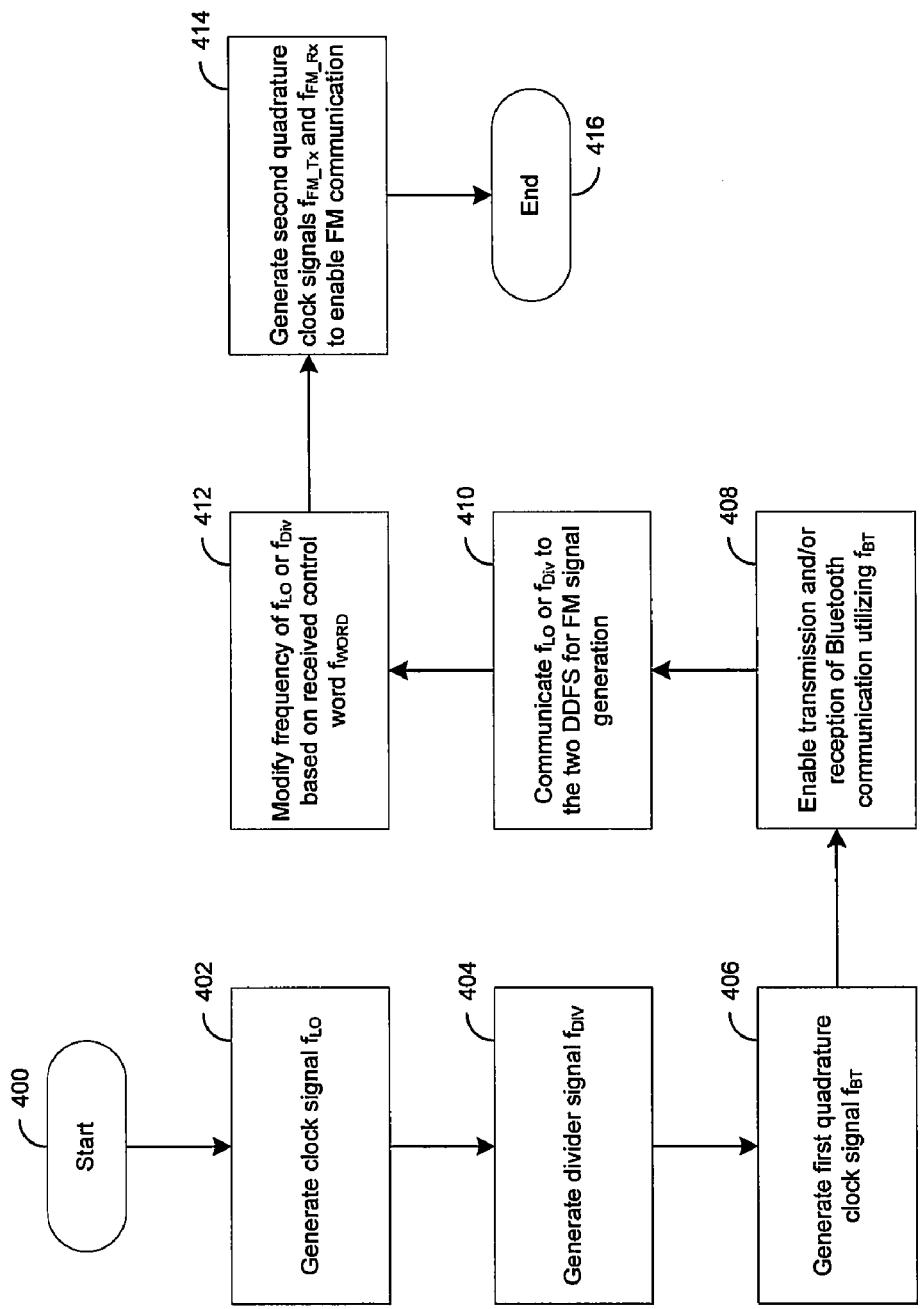
FIG. 4 is a flow diagram illustrating exemplary steps for using direct digital frequency synthesizers (DDFS) with a plurality of communication protocols to generate clocking signal for FM transceiver, which may be utilized in accordance with an embodiment of the invention.

FIG. 4 is a flow diagram illustrating exemplary steps for using digital frequency synthesizers (DDFS) with a plurality of communication protocols to generate clocking signal for FM transceiver, which may be utilized in accordance with an embodiment of the invention. Referring to FIG. 4, exemplary steps may begin at step 400. In step 402, the VCO 220 may generate a clock signal $f_{LO}$ at a particular frequency, for example, 1.6 GHz utilizing the fractional synthesizer 222. In step 404, an output clock signal $f_{DIV}$ may be generated by dividing a frequency of the generated clock signal $f_{LO}$. In step 406, a first quadrature clock signal $f_{BT}$ may be generated by mixing the generated clock signal $f_{LO}$ with the generated output clock signal $f_{DIV}$. In step 408, the generated first quadrature clock signal $f_{BT}$ may be utilized to enable the transmission and/or reception of the Bluetooth communication signals by the BT transceiver 202. In step 410, the generated output clock signal $f_{LO}$ may be communicated to two different DDFS.

In another embodiment, the generated clock signal, $f_{Div}$ may be communicated to the DDFS instead of the $f_{LO}$ signal. Furthermore, the clock signal, whether it is $f_{LO}$ or $f_{Div}$, may be communicated first to signal dividers where the signal may be reduced by a scaling factor. In step 412, the two DDFS may enable modification of a frequency of the communicated output clock signal $f_{DIV}$ or communicated clock signal $f_{LO}$ based on received control word frequencies $f_{WORD\_Tx}$ and/or $f_{WORD\_Rx}$. The control word frequencies may be utilized to compensate for frequency deviations in $f_{LO}$ or $f_{Div}$, which may be caused by frequency hopping for Bluetooth® communication. In step 414, second quadrature clock signals $f_{FM\_Rx}$ and $f_{FM\_Tx}$ may be generated utilizing the generated clock signal $f_{LO}$ or the generated output clock signal $f_{DIV}$ to enable the transmission and/or reception of FM communication signals. Control then passes to end step 416.

In accordance with an embodiment of the invention, aspects of an exemplary system may comprise, on a chip, the BT LOGEN 204 that may generate an initial signal $f_{LO}$ which may be utilized to clock a Bluetooth® (BT) transceiver 202. The LOGEN may comprise a Voltage Controlled Oscillator (VCO) 220 generating signals in the 1.6 GHz range. The generated signal $f_{LO}$ may be utilized to generate a quadrature signal $f_{Div}$ via a signal divider 232. The quadrature signal $f_{Div}$ may comprise an (I) and (Q) phase signals $f_{Div\_Q}$ and $f_{Div\_I}$. The initial signal $f_{LO}$ may be mixed with the quadrature signal $f_{Div}$ to generate a quadrature Bluetooth (BT) clock frequency $f_{BT}$, which may comprise (I) and (Q) LO signals $f_{BT\_Q}$ and $f_{BT\_I}$.

The BT LOGEN 204 may also be utilized to generate clocking signals for FM radio transmission and reception. For example, the initial signal $f_{LO}$ may be communicated to DDFS 208 and 214, either directly or via divider blocks 206a and 206b. The divider block 206a may reduce the frequency of the input signal by a factor that may be determined by, for example, the baseband processor 154 and/or the processor 156 for FM transmission and/or reception. The divider block 206b may also reduce the frequency of the input signal by a factor that may be determined by, for example, the baseband processor 154 and/or the processor 156 for FM transmission.

The output of the divider block 206a may be communicated to the DDFS 208 as a reference clock. The DDFS 208 may further reduce the frequency of the signal from the divider block 206a to generate, for example, $f_{FM\_Rx}$, having (I) and (Q) LO signals, for the FM receiver 210. Since the DDFS 208 may generate signals with a single frequency at a given time, the FM receiver 210 may operate in a half-duplex mode. The output of the divider block 206b may be communicated to the DDFS 214 as a reference clock. The DDFS 214 may further reduce the frequency of the signal from the divider block 206b to generate, for example, $f_{FM\_Tx}$, having (I) and (Q) LO signals, for the FM transmitter 216. Since the DDFS 214 may generate signals with a single frequency at a given time, the FM transmitter 216 may operate in a half-duplex mode. The FM transmit frequency and the FM receive frequency may comprise different frequencies. The Digital-Analog-Converters (DAC) 242a and 242b may enable conversion of the output signals of DDFS 208 and 214 from analog to digital; the Low Pass Filters (LPF) 244a and 244b may be utilized to filter the output signals of the DDFS 208 and 214 before being communicated to the FM receiver 210 and FM transmitter 216.

The outputs of each DDFS may be a constant frequency while the inputs to each DDFS may vary in frequency. For example, while the Bluetooth® LO signal may vary in frequency as Bluetooth® frequency hopping occurs, the FM LO signals may remain constant for a specific channel frequency. The DDFS may utilize frequency control words inputted from processors.

By effectively controlling the DDFS 208 and 214, a simultaneous transmission and reception of BT signals and FM signals, respectively, may be simulated. Time division duplexing of transmission of FM signals and reception of FM signals may be performed by switching the frequency control words between a plurality of values in successive time intervals.

Another embodiment of the invention may provide a machine-readable storage, having stored thereon, a computer program having at least one code section executable by a machine, thereby causing the machine to perform the steps as described herein for using the BT LOGEN to clock two or more DDFS that may be utilized to enable FM transmission and FM reception.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communicating signals, the method comprising:
   in a chip that handles communication of Bluetooth signals and FM signals:
      generating a clock signal at a particular frequency;
      dividing said generated clock signal to produce a frequency divided clock signal, which is mixed with said generated clock signal to enable transmission of said Bluetooth signals and/or reception of said Bluetooth signals; and
      selecting said generated clock signal or said frequency divided clock signal for clocking at least a first direct digital frequency synthesizer (DDFS) to enable processing of signals for FM radio transmission, and for clocking at least a second direct digital frequency synthesizer (DDFS) to enable processing of signals for FM radio reception.

2. The method according to claim 1, wherein said clock signal is generated via a local oscillator (LO) circuit.

3. The method according to claim 2, wherein said local oscillator (LO) circuit comprises at least a voltage controlled oscillator (VCO) and a fractional synthesizer.

4. The method according to claim 1, wherein said frequency divided clock signal comprises an in-phase (I) component and a quadrature (Q) component.

5. The method according to claim 4, comprising selecting from one of said in-phase (I) component and said quadrature (Q) component of said frequency divided clock signal for clocking at least said first direct digital frequency synthesizer (DDFS) and/or for clocking at least a second direct digital frequency synthesizer (DDFS).

6. The method according to claim 1, comprising dividing said first DDFS clock signal.

7. The method according to claim 1, comprising dividing said second DDFS clock signal.

8. The method according to claim 1, wherein said transmission of said FM radio signals occurs at a first frequency and said reception of FM radio signals occurs at a second frequency.

9. The method according to claim 1, comprising generating one or more frequency control words that control generation of DDFS output signals.

10. The method according to claim 9, comprising simulating simultaneous transmission FM radio signals and reception of FM radio signals by switching said generated one or more frequency control words.

11. The method according to claim 9, comprising switching said generated one or more frequency control words between plurality of values in successive time intervals to perform time division duplexing of transmitted and/or received signals.

12. The method according to claim 9, comprising adjusting said generated one or more frequency control words, which control said generation of DDFS output signal to compensate for changes in frequency of an input signal.

13. A machine-readable storage having stored thereon, a computer program having at least one code section for wireless communications, the at least one code section being executable by a machine for causing the machine to perform steps comprising:
   in a chip that handles communication of Bluetooth signals and FM signals:
      generating a clock signal at a particular frequency;
      dividing said generated clock signal to produce a frequency divided clock signal, which is mixed with said generated clock signal to enable transmission of said Bluetooth signals and/or reception of said Bluetooth signals; and
      selecting said generated clock signal or said frequency divided clock signal for clocking at least a first direct digital frequency synthesizer (DDFS) to enable processing of signals for FM radio transmission, and for clocking at least a second direct digital frequency synthesizer (DDFS) to enable processing of signals for FM radio reception.

14. The machine-readable storage according to claim 13, wherein said clock signal is generated via a local oscillator (LO) circuit.

15. The machine-readable storage according to claim 14, wherein said local oscillator (LO) circuit comprises at least a voltage controlled oscillator (VCO) and a fractional synthesizer.

16. The machine-readable storage according to claim 13, wherein said frequency divided clock signal comprises an in-phase (I) component and a quadrature (Q) component.

17. The machine-readable storage according to claim 16, comprising selecting from one of said in-phase (I) component and said quadrature (Q) component of said frequency divided clock signal for clocking at least said first direct digital frequency synthesizer (DDFS) and/or for clocking at least said second direct digital frequency synthesizer (DDFS).

18. The machine-readable storage according to claim 13, comprising dividing said first DDFS clock signal.

19. The machine-readable storage according to claim 13, comprising dividing said second DDFS clock signal.

20. The machine-readable storage according to claim 13, wherein said transmission of FM radio signals occurs at a first frequency and said reception of FM radio signals occurs at a second frequency.

21. The machine-readable storage according to claim 13, comprising generating one or more frequency control words that control generation of a DDFS output signal.

22. The machine-readable storage according to claim 21, comprising simulating simultaneous transmission FM radio signals and reception of FM radio signals by switching said generated one or more frequency control words.

23. The machine-readable storage according to claim 21, comprising switching said generated one or more frequency control words, between a plurality of values in successive time intervals to perform time duplexing of transmitted and/or received signals.

24. The machine-readable storage according to claim 21, comprising adjusting said generated one or more frequency control words, which control said generation of DDFS output signal to compensate for changes in frequency of an input signal.

25. A system for wireless communications, the system comprising:
  one or more circuits in a chip that handles communication of Bluetooth signals and FM signals, wherein said one or more circuits enable generation of a clock signal at a particular frequency;
  said one or more circuits enable division of said generated clock signal to produce a frequency divided clock signal, which is mixed with said generated clock signal to enable transmission of said Bluetooth signals and/or reception of said Bluetooth signals; and
  said one or more circuits enable selection from said generated clock signal or said frequency divided clock signal for clocking at least a first direct digital frequency synthesizer (DDFS) to enable processing of signals for FM radio transmission, and for clocking at least a second direct digital frequency synthesizer (DDFS) to enable processing of signals for FM radio reception.

26. The system in claim 25, wherein said one or more circuits comprise a local oscillator (LO) circuit that generates said clock signal.

27. The system in claim 26, wherein said one or more circuits, which comprise said local oscillator (LO) circuit, comprise at least a voltage controlled oscillator (VCO) circuit and a fractional synthesizer circuit.

28. The system in claim 25, wherein said frequency divided clock signal comprise an in-phase (I) component and a quadrature (Q).

29. The system in claim 28, comprising selection from one of said in-phase (I) component and a quadrature (Q) component of said frequency divided clock signal for clocking at least said first direct digital frequency synthesizer (DDFS) and/or for clocking at least said second direct digital frequency synthesizer (DDFS).

30. The system in claim 25, wherein said one or more circuits comprise a first signal divider, and said one or more circuits divides said first DDFS clock signal.

31. The system in claim 25, wherein said one or more circuits comprise a second signal divider, and said one or more circuits divide said second DDFS clock signal.

32. The system in claim 25, wherein said transmission of said FM radio signals occurs at a first frequency and said reception of FM radio signals occurs at a second frequency.

33. The system in claim 25, wherein said one or more circuits generate one or more frequency control words that control generation of DDFS output signal.

34. The system in claim 33, wherein said one or more circuits simulate simultaneous transmission FM radio signals and reception of FM radio signals by switching said generated one or more frequency control words.

35. The system in claim 33, wherein said one or more circuits switches said generated one or more frequency control words, between plurality of values in successive time intervals to perform time division duplexing of transmitted and/or received signals.

36. The system in claim 33, wherein said one or more circuits adjusts said generated one or more frequency control words, which control said generation of DDFS output signal to compensate for changes in frequency of an input signal.

* * * * *